(12) United States Patent
Gong et al.

(10) Patent No.: US 10,439,021 B2
(45) Date of Patent: Oct. 8, 2019

(54) CAPACITOR STRUCTURE

(71) Applicant: GLOBALFOUNDRIES Singapore Pte. Ltd., Singapore (SG)

(72) Inventors: Shunqiang Gong, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/365,953

(22) Filed: Dec. 1, 2016

(65) Prior Publication Data
US 2018/0158897 A1 Jun. 7, 2018

(51) Int. Cl.
*H01L 49/02* (2006.01)
(52) U.S. Cl.
CPC .................... *H01L 28/87* (2013.01)
(58) Field of Classification Search
CPC ........... H01L 28/40–92; H01L 29/7408; H01L 2924/1205; H01L 2924/19041; H01L 27/0288; H01L 27/0629; H01L 27/0635; H01L 27/0647–0652; H01L 27/0711–0733; H01L 27/0777; H01L 27/0783–0794; H01L 21/76816; H01L 23/5525; H01L 23/5226; H01L 28/87–92
See application file for complete search history.

(56) References Cited

U.S. PATENT DOCUMENTS

| 2012/0049322 A1* | 3/2012 | Su | H01L 21/76898 257/532 |
| 2012/0181658 A1* | 7/2012 | Mohammed | H01G 4/06 257/532 |
| 2014/0144681 A1* | 5/2014 | Pushparaj | C03C 17/3435 174/257 |

\* cited by examiner

*Primary Examiner* — Moazzam Hossain
*Assistant Examiner* — Stanetta D Isaac
(74) *Attorney, Agent, or Firm* — Thompson Hine LLP (57) ABSTRACT

Devices and methods for forming a device are disclosed. A substrate is provided. The substrate has first and second major surfaces. A capacitor is disposed in the substrate. The capacitor includes a first electrode, a second electrode and an insulator separating the first and second electrodes. The second electrode encloses the first electrode and the insulator.

15 Claims, 8 Drawing Sheets

CAPACITOR STRUCTURE

BACKGROUND

A capacitor typically includes two electrodes on opposing sides of a dielectric material. The electrodes of a metal-insulator-metal (MIM) capacitor are essentially metallic materials. Metal-insulator-metal (MIM) capacitors are used in integrated circuit (IC) for signal conditioning. Large MIMs are particularly important to boost circuit performance of 2.5D and 3D packages.

MIM capacitors are typically formed during back end of line (BEOL) processing. These capacitors are formed horizontally, utilizing the metal layers in the interlevel dielectric (ILD) layers. However, forming such MIM capacitors requires additional process steps which leads to an increase in manufacturing costs. Furthermore, such horizontally formed MIM capacitors inevitably take up a considerable amount of area, preventing a high density of capacitor network to be formed.

Therefore, it is desirable to provide simplified and cost efficient techniques for forming a high density capacitor network.

SUMMARY

Embodiments generally relate to semiconductor devices and methods of forming a semiconductor device. In one embodiment, a device is presented. The device includes a substrate. The substrate has first and second major surfaces. A capacitor is disposed in the substrate. The capacitor includes a first electrode, a second electrode and an insulator separating the first and second electrodes. The second electrode encloses the first electrode and the insulator.

In one embodiment, a device is disclosed. The device includes an interposer. The interposer has first and second major surfaces. A cylindrical capacitor is disposed in the interposer. The capacitor includes a first electrode, a second electrode and an insulator separating the first and second electrodes. The first and second electrodes are concentric.

In another embodiment, a method for forming a device is disclosed. The method includes providing a substrate. The substrate has first and second surfaces. The method includes forming a capacitor in the substrate. The capacitor includes a first electrode, a second electrode and an insulator separating the first and second electrodes. The second electrode encloses the first electrode and the insulator.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which.

DETAILED DESCRIPTION

Embodiments generally relate to semiconductor devices. More particularly, embodiments relate to capacitors formed in interposer or active wafers using through substrate via (TSV) technology. Interposer wafers may be used in packaging one or more devices, such as integrated circuits (ICs) to form 2.5D or 3D packages. For example, an interposer wafer with TSV contacts may facilitate in forming 2.5D packages including system-on-chip (SoC) devices while active wafer with TSV contacts may facilitate in forming 3D packages. The devices can be incorporated into, for example, consumer electronic products, such as computers, cell phones, and personal digital assistants (PDAs). Incorporating the devices in other applications may also be useful.

Figure 1A:
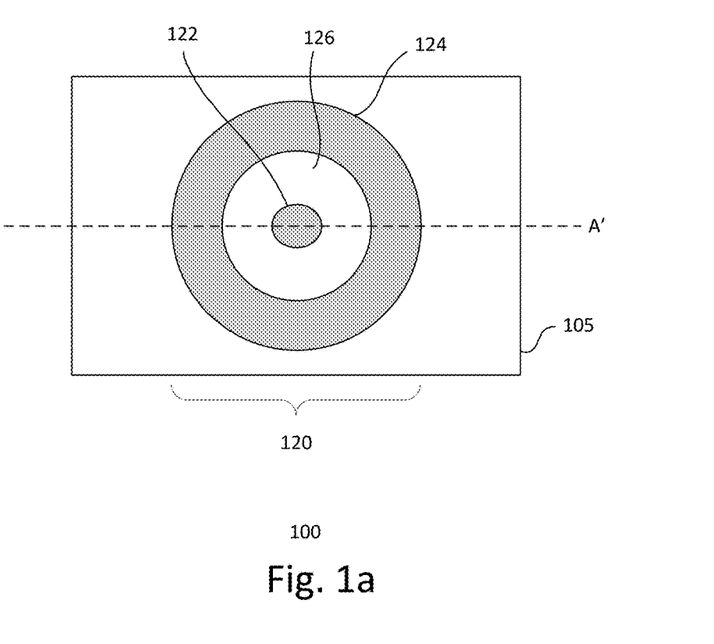
FIGS. 1a-1b show a plan view and a cross-sectional view of an embodiment of a portion of a device.
Figure 1B:
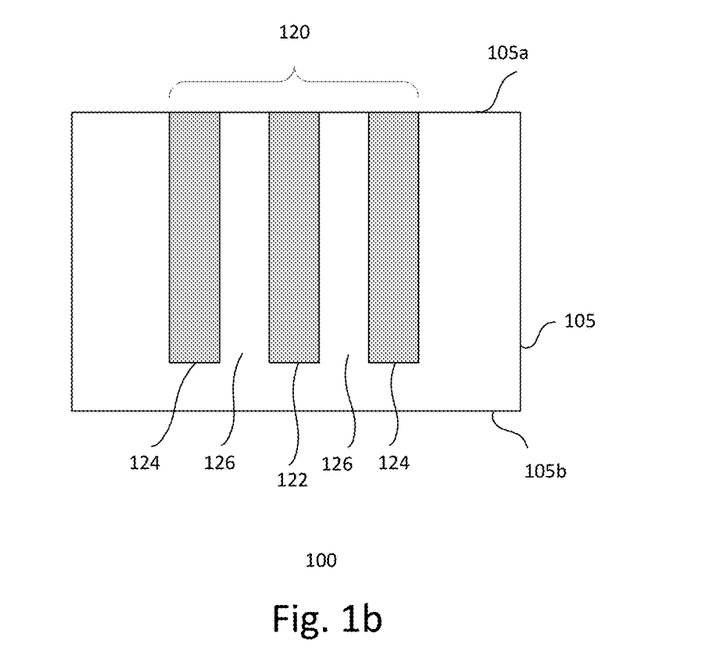

FIG. 1a shows a plan view of a portion of a device 100 and FIG. 1b shows a cross sectional view of the device along line A-A' of FIG. 1a. In one embodiment, the device is an interposer. In an alternate embodiment, the device is an active device. The device includes a substrate 105. In one embodiment, the substrate 105 may be a glass substrate. The glass substrate may be a fusion glass substrate. The glass substrate may, for example, be flexible. The thickness of the glass substrate, for example, may be about 100-200 µm. In other embodiments, the substrate 105 may be a silicon substrate. Other types of substrates, such as silicon germanium, germanium, gallium arsenide, or crystal-on-insulator (COI) such as silicon-on-insulator (SOI), are also useful. The substrate may be a doped substrate. The substrate can be lightly doped with p-type dopants. For example, the substrate may be silicon substrate, intrinsic or doped with other types of dopants or dopant concentrations. The substrate may be a part of a wafer which is processed in parallel to form a plurality of devices. The thickness of the silicon substrate, for example, may be about 100-200 µm. Other suitable thickness dimensions may also be useful.

The substrate 105 includes first and second major surfaces 105a and 105b. The first major surface 105a may be the top surface on which an IC is mounted while the second major surface 105b is the bottom surface which is mounted onto, for example, an external component, such as a package substrate or a circuit board. In one embodiment, the first major surface may be the top surface of the substrate. In another embodiment, the top surface of the substrate may have been processed in the front-end-of-line (FEOL) processing to include a plurality of devices (not shown) and a pre-metal dielectric (PMD) layer covering the devices. The devices, for example, may include transistors and resistors while the PMD layer may be referred to as the contact level prior to the first metal level/layer of the back-end-of-line (BEOL) processing. In such case, the first major surface 105a may correspond to the top surface of the PMD layer.

The substrate 105 includes a capacitor 120. The capacitor, for example, is a metal-insulator-metal (MIM) capacitor. The capacitor 120 includes a first or inner electrode 122, a second or outer electrode 124 and an insulator 126. In one embodiment, the capacitor 120 is a cylindrical capacitor having a length l and at least two concentrically arranged circular electrodes separated by the insulator. For example, the first or inner electrode 122 forms an inner core, the second or outer electrode 124 forms an outer ring and the insulator 126 forms an insulator ring between the inner and outer electrodes. The outer electrode 124 encloses the inner electrode 122 and insulator 126, as shown in FIG. 1a. The diameter of the inner electrode may be about 5-10 µm. The inner diameter of the outer electrode may be about 45-90 µm and the outer diameter of the outer electrode may be about 55-110 µm. The distance between the perimeter of the core circle and the inner diameter of the outer electrode defines the thickness of the insulator ring 126. In one embodiment, the distance may be about 20-40 µm. Other suitable diameters and thicknesses may also be useful. The thickness of the insulator ring 126 determines the capacitance per unit length of the capacitor 120.

In one embodiment, the electrodes extend to a depth d from the first major surface 105a of the substrate 105. For example, the electrodes may extend to about 100-120 µm from the top surface of the substrate or top surface of the PMD layer. The depth d defines the length l of the cylindrical capacitor. Other suitable depth dimensions may also be useful. As shown, the top surface of the electrodes is substantially coplanar with the first major surface 105a while the bottom surface of the electrodes is disposed above and is away from the second major surface 105b of the substrate. In another embodiment, the electrodes may extend through the first and second major surfaces of the substrate 105. In such case, the electrodes may have a bottom surface that is substantially coplanar with the second major surface of the substrate.

In one embodiment, the electrodes are disposed in vias formed in the substrate 105. The vias, for example, are formed using through substrate via (TSV) technology. In one embodiment, a Via-Middle process is performed to form the vias. The first electrode 122 is disposed in a first via and the second electrode 124 is disposed in a second via. The vias may have the same depth from the first major surface 105a of the substrate 105. The first and second vias are filled with a conductive material to form the first and second electrodes. The conductive material may, for example, be copper. Other suitable types of conductive materials for the electrodes may also be useful. The insulator, for example, is made of the material of the substrate 105. In one embodiment, the insulator is part of the substrate 105. The first electrode 122 serves as a first terminal (node) of the capacitor and the second electrode 124 serves as a second terminal (node) of the capacitor 120. Contact pads (not shown) are provided for the terminals of the capacitor 120. The contact pads are coupled to the terminals. The contact pads may be copper contact pads. Other suitable types of conductive contact pads may also be useful.

Figure 2A:
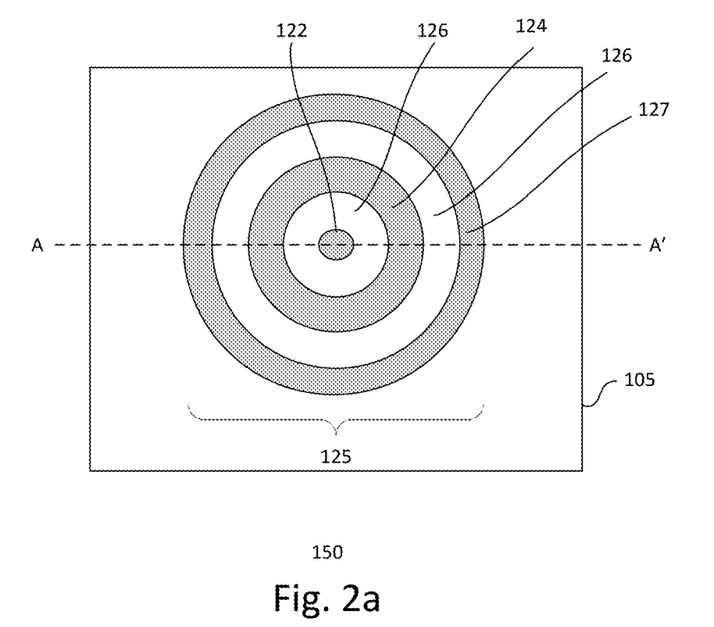
FIGS. 2a-2b show a plan view and a cross-sectional view of another embodiment of a portion of a device.
Figure 2B:
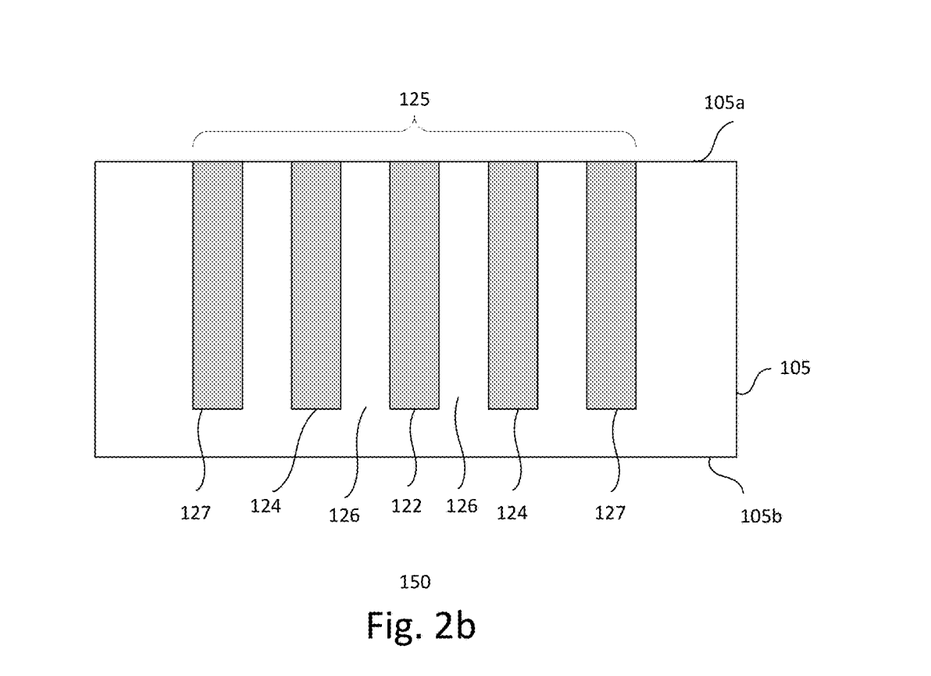

The cylindrical capacitor may include more than one outer ring. For example, the cylindrical capacitor may include 2 outer rings as shown in FIGS. 2a-2b. FIG. 2a shows a plan view of a portion of a device 150. FIG. 2b is a cross-sectional view of the device along line A-A' of FIG. 2a. The inner core 122 and the outermost ring 127 form a first electrode of a capacitor 125, and the ring 124 in between the inner core 122 and the outermost ring 127 forms a second electrode of the capacitor 125. The inner core and the ring 124 are separated by an insulator 126, and the ring 124 and the outermost ring 127 are also separated by the insulator 126. The insulator 126 may be part of the substrate.

When the substrate is a silicon substrate, the vias may be lined with a dielectric liner to provide electrical isolation from the silicon substrate. As shown in FIG. 3b which illustrates a portion of device 200, a dielectric liner 228 lining the sidewalls of the vias isolates the conductive material from the silicon substrate 205. The dielectric liner 228 also lines the first surface 205a of the substrate. The dielectric liner, may be a silicon oxide or silicon nitride liner. Other suitable dielectric materials may also be employed. The dielectric liner may also be a liner stack which includes a silicon oxide liner and a silicon nitride liner. The thickness of the dielectric liner should be sufficient to provide isolation for the electrodes.

Figure 3A:
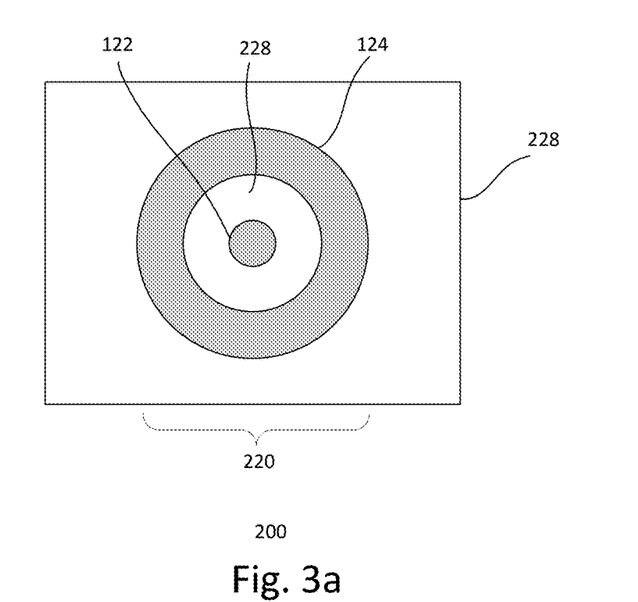
FIGS. 3a-3b show a plan view and a cross-sectional view of another embodiment of a portion of a device.
Figure 3B:
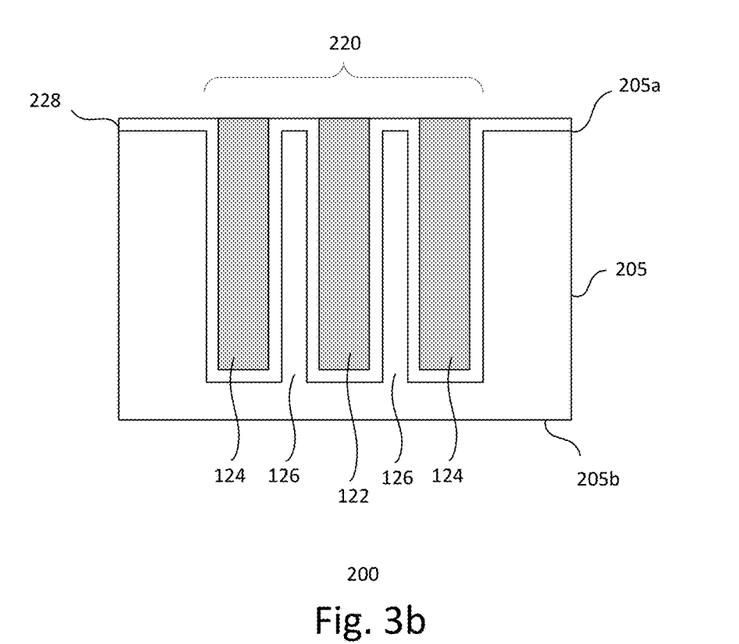

FIG. 3a shows a corresponding plan view of the device 200. The device 200 may be similar to those described in FIGS. 1a-1b. Common elements may not be described or described in detail. As shown in FIGS. 3a-3b, the device 200 is an interposer which includes a cylindrical capacitor 220 having a length l, with at least two concentrically arranged circular electrodes 122 and 124, and an insulator ring 126 between the electrodes. Similar to the capacitor of FIGS. 1a-1b, the capacitor of FIGS. 3a-3b may also include multiple rings.

The substrate of FIGS. 1a-1b, FIGS. 2a-2b and FIGS. 3a-3b may further include through substrate via (TSV) contacts (not shown), depending on the substrate used. The TSV contacts extend through the first and second major surfaces of the substrate and may be used for 3D integration. The TSV contacts are, for example, copper contacts. Other suitable types of conductive materials for the TSV contacts may also be useful. When the substrate is a silicon substrate, the TSV contacts may be lined with a dielectric liner to provide electrical isolation from the silicon substrate. The TSV contacts and liners are disposed in TSV vias. The TSV contacts includes a depth which may be about the same or deeper than the depth of the electrodes of the capacitor. A back-grinding process may be performed on the second surface of the substrate to expose the bottom of the TSV contacts, creating through holes.

The first surface of the substrate of FIGS. 1a-1b, FIGS. 2a-2b and FIGS. 3a-3b includes a redistribution layer (not shown). The redistribution layer (RDL) includes a bottom RDL level and an upper RDL level. The bottom RDL level is disposed over the top surface of the capacitor. The bottom RDL level may include a dielectric layer, such as a silicon oxide layer. Other suitable types of dielectric layers may also be useful. The contact pads of the capacitor are provided in the bottom RDL level. The contact pads may be conductive islands or conductive lines. The contact pads are coupled to the terminals of the capacitor as described in FIGS. 1a-1b, FIGS. 2a-2b and FIGS. 3a-3b.

The upper RDL level includes a plurality of upper RDL levels. The number of upper RDL levels may depend on, for example, design requirements. A RDL dielectric layer is provided for each of the upper RDL level which includes a RDL via level and a RDL line level. A line level of an upper RDL level may be referred to as $M_i$, where i is from 1 to x and is the $i^{th}$ ILD level of x ILD levels. A via level of an upper RDL level may be referred to as $V_{i-1}$, where i is the $i^{th}$ ILD level of x ILD levels and CA is commonly denoted as the first via level. Contacts are provided in the RDL via level and conductive lines are provided in the RDL line level. The contacts and conductive lines are, for example, copper contacts and lines formed by dual damascene technique. Other suitable techniques for forming the interconnects, such as the copper contacts and lines, or configurations of RDL levels may also be useful.

Figure 4:
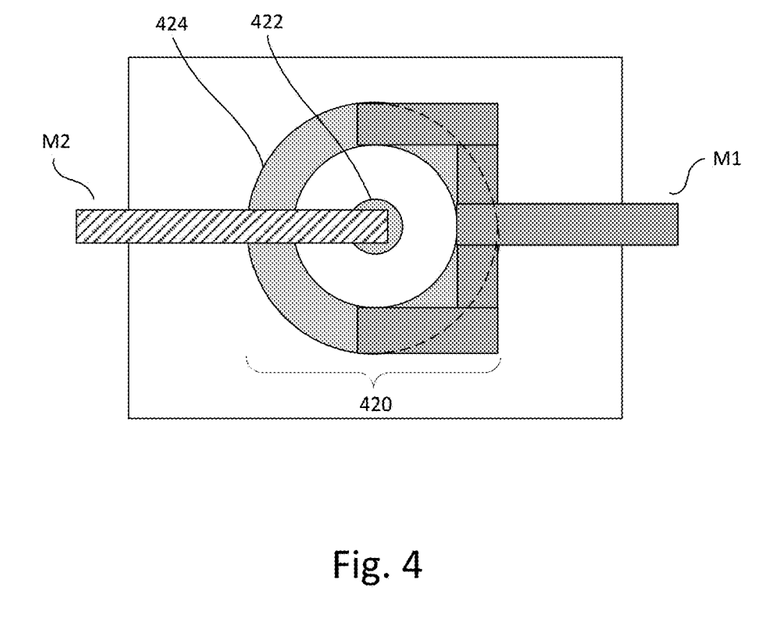
FIG. 4 shows a simplified plan view of an embodiment of a device coupled to different line levels in an upper RDL level.
Figure 5:
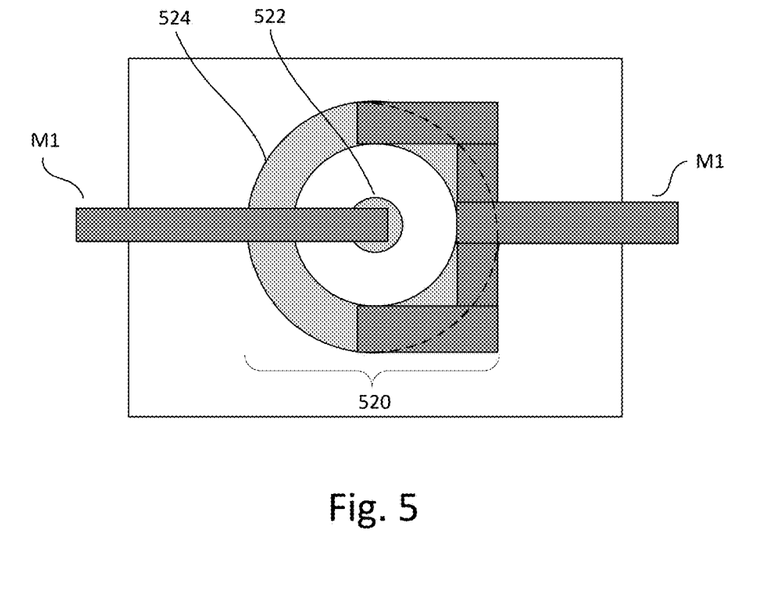
FIG. 5 shows a simplified plan view of an embodiment of a device coupled to the same line level in an upper RDL level.

The coupling of the electrodes of the capacitor to the upper RDL levels may depend on design requirements. The coupling may be between any two adjacent levels, for example, between the lowermost level and the adjacent level, or between a second level and third level. As shown in FIG. 4, the contact pad of the first electrode 422 of capacitor 420 is coupled to a contact pad in M2 and the contact pad of the second electrode 424 is coupled to a contact pad in M1. The coupling may also be within the same level, as illustrated in FIG. 5. As shown, the contact pad of the first electrode 522 is coupled to a contact pad in M1 and the contact pad of the second electrode 524 is coupled to another contact pad in M1. In another embodiment, in the case where the electrodes of the capacitor extend from the top surface of the substrate (e.g., where top surface of the electrodes are substantially coplanar with top surface of the substrate), additional contact plugs may be used to couple the electrodes to the contact pad in M1. The contact plugs may include tungsten, polysilicon or copper material. Other suitable conductive materials may also be useful.

A pad level is disposed over the RDL. For example, the pad level is disposed over the top of the upper RDL level. The pad level includes contact pads disposed in a pad dielectric layer. The contact pads, for example, are aluminum contact pads. Other suitable types of contact pads may also be useful. The contact pads provide a basis of electrical connection for connecting to an IC which is mounted onto the interposer. The contact pads may also couple the capacitor to a power source for filtering or decoupling purposes.

As for the second substrate surface, it includes conductive bumps or conductive contacts (not shown). Where the substrate is an interposer substrate, the conductive contacts may be referred to as interposer contacts. The conductive contacts are coupled to the TSV contacts. The conductive contacts, for example, include solder balls. Other suitable types of conductive contacts may also be useful. A dielectric layer may be provided on the surface of the second substrate surface. The dielectric layer, for example, includes openings exposing the bottom of the TSV contacts and facilitates in the formation of the conductive contacts. The dielectric layer is used as an insulation to prevent shorting between adjacent conductive contacts. In embodiments where the electrodes of the capacitor extend through the first and second major surfaces of the substrate, the dielectric layer may also be used to cover the exposed bottom surfaces of the electrodes of the capacitor.

Figure 6A:
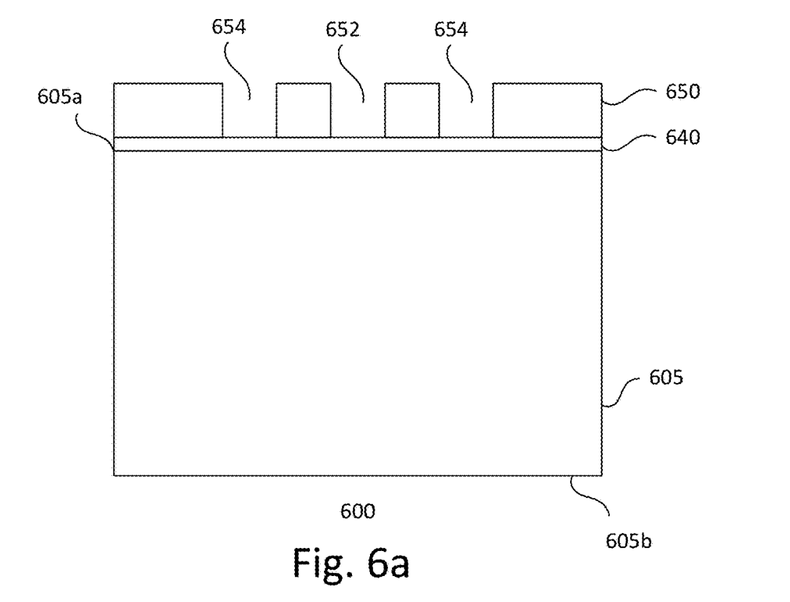
FIGS. 6a-6d show cross-sectional views of an embodiment of a process for forming a device.

FIGS. 6a-6d show cross-sectional views of an embodiment of a process 600 for forming a device. In one embodiment, the process forms a capacitor in an interposer. In one embodiment, the Via-Middle process is performed to form the capacitor. As shown in FIG. 6a, a substrate 605 is provided. The substrate 605 may be a glass substrate. The glass substrate may be a fusion glass. The glass substrate may, for example, be flexible. The substrate may be a part of a wafer which is processed in parallel to form a plurality of devices.

The substrate includes first and second surfaces 605a and 605b. The first surface 605a may be the top surface on which an IC is mounted while the second surface 605b is the bottom surface which is mounted onto an external component, for example, a package substrate or a circuit board. In one embodiment, the first surface may be the top surface of the substrate. In another embodiment, the top surface of the substrate may have been processed in the front-end-of-line (FEOL) processing to include a plurality of devices (not shown) and a pre-metal dielectric (PMD) layer covering the devices. The devices, for example, may include transistors and resistors while the PMD layer may be referred to as the contact level prior to the first metal level/layer of the back-end-of-line (BEOL) processing. In such case, the first surface 605a may correspond to the top surface of the PMD layer.

A hard mask layer 640 is formed on the first surface 605a of the substrate 605. The hard mask layer 640 is used to pattern the substrate 605. The hard mask layer 640 may be a silicon nitride hard mask. In one embodiment, the hard mask layer 640 may be a hard mask stack. For example, the hard mask layer 640 may include a pad oxide on the substrate and a silicon nitride layer over it. The pad oxide, for example, is formed by thermal oxidation while the nitride layer is formed by chemical vapor deposition (CVD). Other suitable configurations of hard mask layer or hard mask stacks may also be useful.

A soft mask layer 650 is formed on the hard mask layer 640. The soft mask layer 650, in one embodiment, is a photoresist layer. The soft mask layer 650 is patterned to form first and second openings 652 and 654. The first opening 652 corresponds to a first electrode and the second opening correspond to a second electrode of a capacitor. The first and second openings form a substantially circular or oval concentric ring openings when viewed from top. To form the openings in the soft mask layer 650, it may be selectively exposed with an exposure source using a reticle. The pattern of the reticle is transferred to the resist layer after exposure by a development process.

Figure 6B:
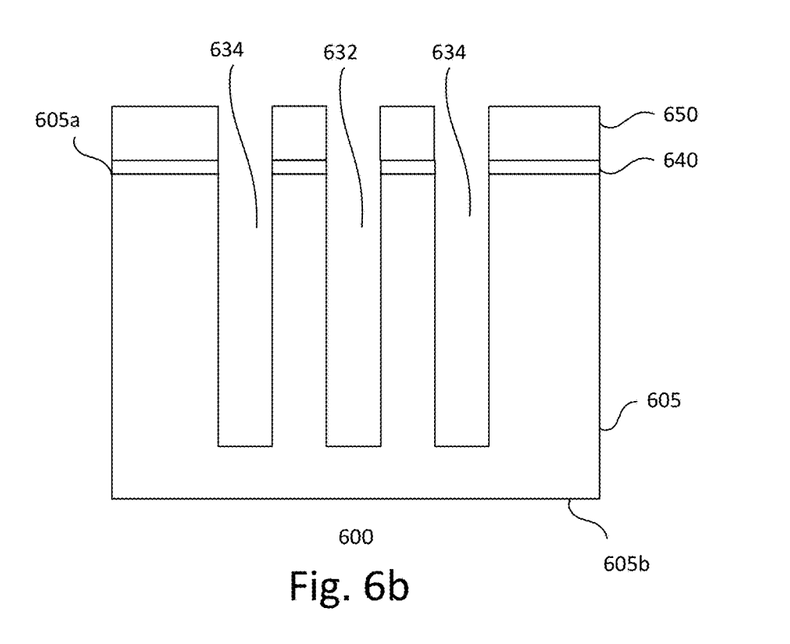

In FIG. 6b, blind vias 632 and 634 are formed in the substrate. The vias may be formed by anisotropic etching, laser assisted processes, e.g., laser ablation, mechanical drilling or any other suitable techniques, using the patterned soft mask layer 650 as an etch mask. In one embodiment, the depth of the vias is shallower than a final or desired thickness of the substrate 605. For example, the bottom surface of the vias 632 and 634 is disposed above and is away from the second surface of the substrate. This ensures that the subsequently formed electrodes do not extend through the bottom surface of the substrate.

After forming the vias, the soft mask layer 650 is removed by, for example, ashing. Other suitable techniques may also be used to remove the soft mask layer 650. The hard mask layer 640 is removed after the removal of the soft mask layer 650. Alternatively, the hard mask layer 640 may remain after the removal of the soft mask layer 650, depending on process integration.

Figure 6C:
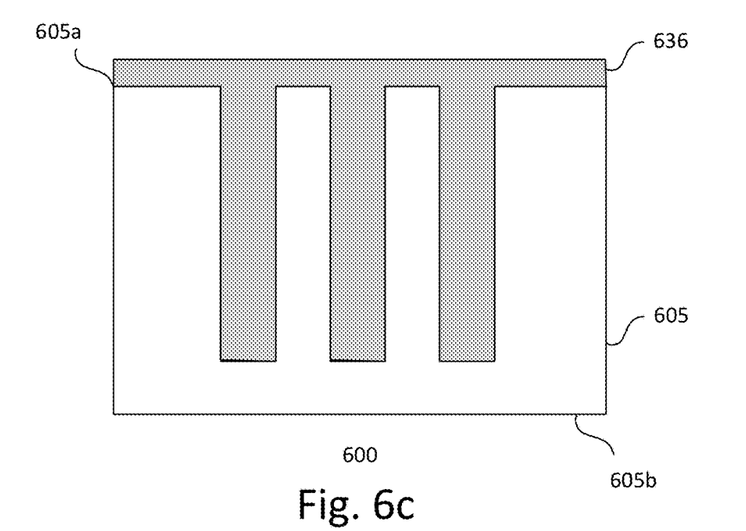

The process continues to fill the vias with a conductive material. As shown in FIG. 6c, a conductive layer 636 is formed on the substrate, filling the vias and covering the substrate. In one embodiment, the conductive layer includes a copper (Cu) layer. The conductive layer, for example, is formed by electroplating. Other suitable types of conductive material and techniques for forming the conductive layer may also be useful.

Figure 6D:
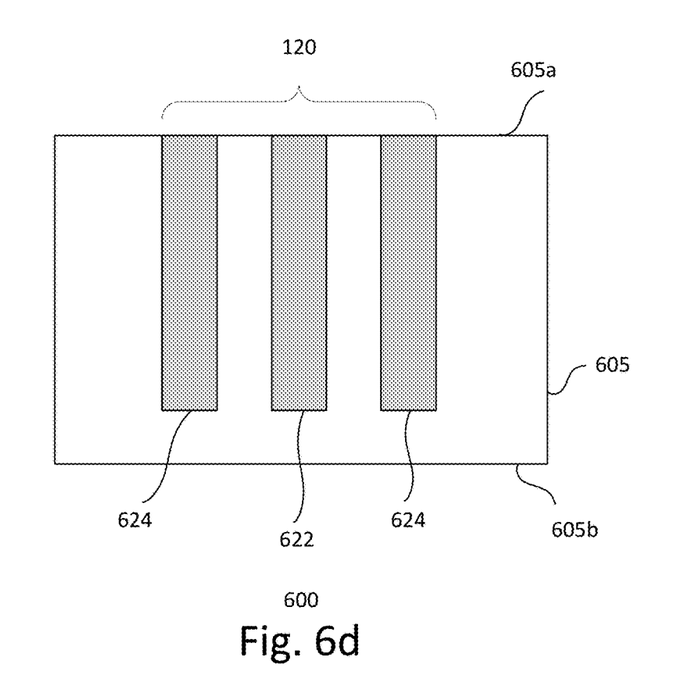

A planarization process is performed on the substrate 605, as shown in FIG. 6d. The planarization process removes excess conductive layer 636 to form a first (inner) electrode 622 and a second (outer) electrode 624 of a capacitor 120 as described in FIGS. 1a-1b. In one embodiment, the planarization process includes chemical mechanical polishing (CMP). Other planarizing processes, including an electroCMP (eCMP) or a combination of planarization processes may also be useful. The CMP removes excess conductive material and produces a planar surface between the conductive material in the vias and substrate.

The process continues, for example, to form a RDL on the first surface 605a of the substrate 605, and conductive bumps or conductive contacts on the second surface 605b of the substrate 605. Such processes are performed, for example, using conventional techniques. After processing of the interposer wafer is completed, it is diced to singulate the interposers into individual interposers.

FIGS. 7a-7d show cross-sectional views of another embodiment of a process 700 for forming a device. The process is similar to that described in FIGS. 6a-6d. Common elements may not be described or described in detail.

Figure 7A:
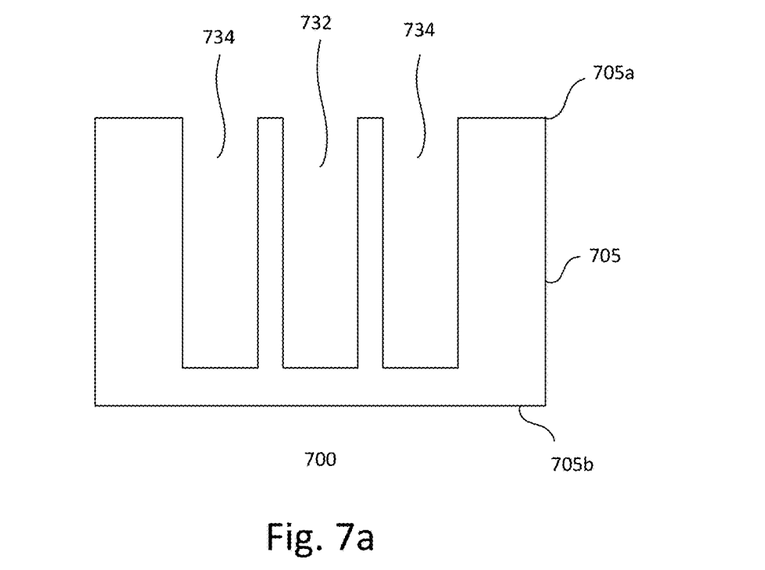
FIGS. 7a-7d show cross-sectional views of another embodiment of a process for forming a device.

Referring to FIG. 7a, a substrate 705 is provided. The substrate includes first and second major surfaces 705a-705b. The substrate 705 may be a silicon substrate. Other types of substrates, such as silicon germanium, germanium, gallium arsenide, or crystal-on-insulator (COI) such as silicon-on-insulator (SOI), are also useful. The substrate may be a doped substrate. The substrate can be lightly doped with p-type dopants. For example, the substrate may be silicon substrate, intrinsic or doped with other types of dopants or dopant concentrations. The substrate may be a part of a wafer which is processed in parallel to form a plurality of devices.

The substrate 705 is at the stage of processing as described in FIG. 6b. For example, blind vias 732 and 734 are formed in the substrate 705. The soft mask layer formed over the hard mask layer which is used to form the vias is removed. The hard mask layer may also be removed, depending on process integration.

Figure 7B:
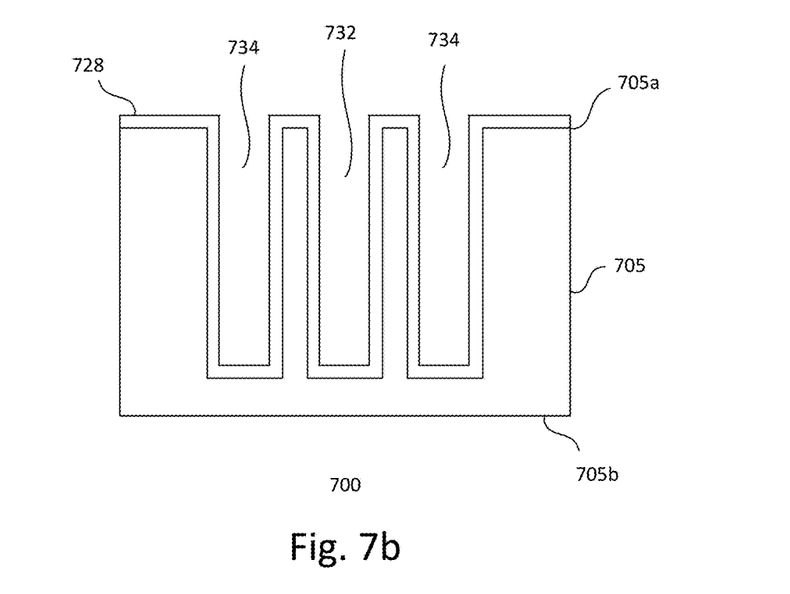

FIG. 7b shows that a dielectric liner 728 is formed on the substrate 705. In one embodiment, the dielectric liner 728 lines the vias and surface of the substrate. The thickness of the dielectric liner 728 should be sufficient to provide isolation for the electrodes formed in the later processing steps. The dielectric liner, for example, is a silicon oxide liner formed by, for example, CVD. Other suitable dielectric materials and forming techniques may also be employed.

Figure 7C:
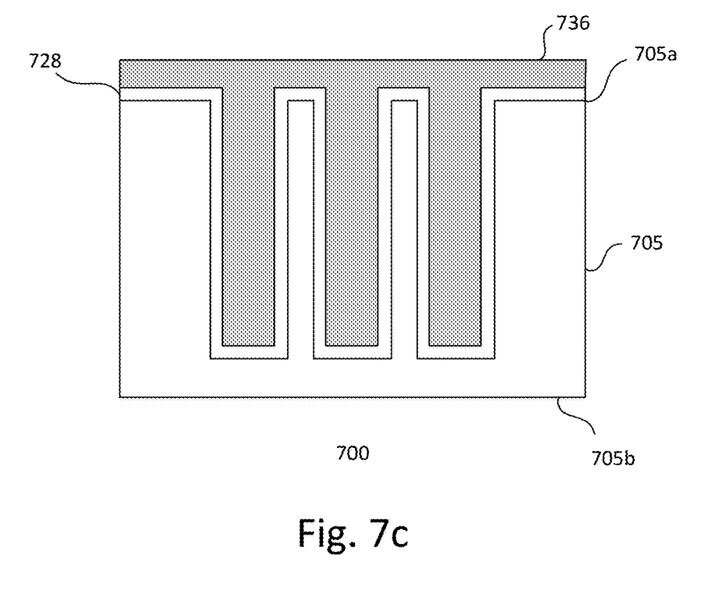

Referring to FIG. 7c, a conductive layer 736 is formed on the substrate, filling the vias and covering the substrate. In one embodiment, the conductive layer 736 includes a copper (Cu) layer. The conductive layer 736, for example, is formed by electroplating. Other suitable types of conductive material and techniques for forming the conductive layer may also be useful.

Figure 7D:
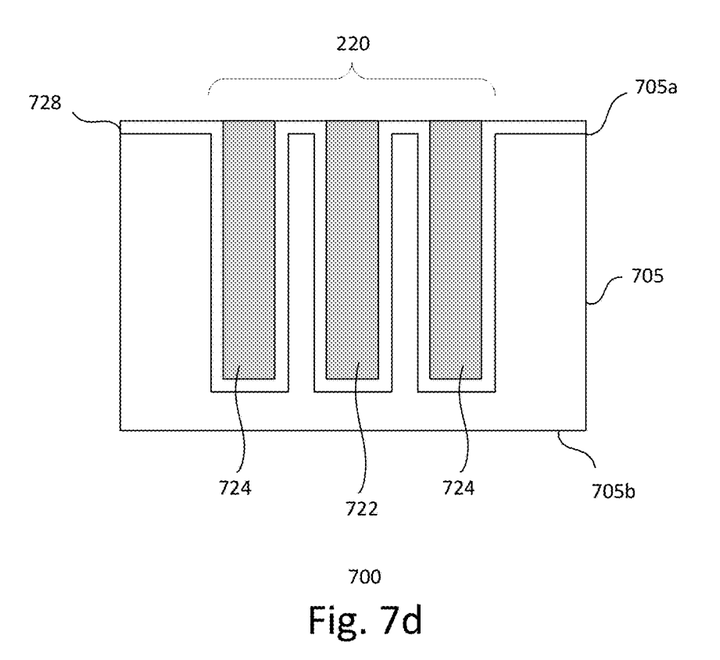

A planarization process is performed on the substrate, as shown in FIG. 7d. The planarization process removes excess conductive layer to form a first (inner) electrode 722 and a second (outer) electrode 724 of a capacitor 220 as described in FIGS. 3a-3b. In one embodiment, the planarization process includes chemical mechanical polishing (CMP). Other planarizing processes, including an electroCMP (eCMP) or a combination of planarization processes may also be useful. The CMP removes excess conductive material and produces a planar surface between the conductive material in the vias and dielectric liner layer.

The process continues, for example, to form a RDL on the first surface 705a of the substrate 705, and conductive bumps or conductive contacts on the second surface 705b of the substrate 705. Such processes are performed, for example, using conventional techniques. After processing of the interposer wafer is completed, it is diced to singulate the interposers into individual interposers.

In some embodiments, the capacitor can be simultaneously formed with TSV contacts disposed in the same substrate. The TSV contacts, for example, may be used for 3D integration. In such case, the vias (e.g., 632, 634, 732, 734) as described in FIG. 6b and FIG. 7b may be simultaneously formed with vias which are used for accommodating the TSV contacts. The depth of the vias for accommodating the electrodes of the capacitor and the depth of the vias for accommodating the TSV contacts may be about the same. The depth of the vias, for example, may be the same or deeper than a final or desired thickness of the substrate. When a back-grinding process is performed on the second surface (backside) 605b or 705b of the substrate to produce the desired thickness and to expose the bottom surface of the TSV contacts, the subsequently formed electrodes extend through the top and bottom surfaces of the final substrate. In another embodiment, the depth of the vias for accommodating the electrodes of the capacitor and the depth of the vias for accommodating the TSV contacts may be different. In such case, the vias for accommodating the TSV contacts may be formed separately and the depth of the vias for accommodating the TSV contacts may be deeper than the depth of the vias for accommodating the electrodes of the capacitor. Thus, when the back-grinding process is performed, the back-grinding process exposes the bottom surface of the TSV contacts without exposing the bottom surface of the electrodes of the capacitor.

Although one capacitor is shown in the substrate, it is understood that the substrate may include two or more capacitors disposed and formed in the same substrate. The capacitors, for example, may be disposed in between devices processed by the front-end-of-line (FEOL) processing.

The embodiments as described above result in advantages. The embodiments as described, for example, enable MIM capacitors to be formed in the interposer using the existing TSV technology. As described, in some embodiments, the MIM capacitors can be formed simultaneously with the conventional TSV contacts without any additional process steps or lithography mask layers, thereby reducing manufacturing costs. In addition, the capacitors are formed vertically in the interposer. Therefore, higher density of capacitors can be achieved as compared to capacitors that are formed horizontally, for example, in the metal levels. Furthermore, the capacitors that are formed vertically can replace decoupling capacitors which tend to occupy a large chip area and often requires additional process steps. Thus, the embodiments as described are simplified processes and are highly compatible and can be integrated with existing manufacturing process.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate having a top major surface and a bottom major surface; and
   a capacitor disposed in the substrate, the capacitor including a first electrode, a second electrode, and a first insulator separating the first electrode and the second electrode, the first electrode including a solid cylindrical core and the second electrode including a first ring arranged to surround the solid cylindrical core and the first insulator, wherein the first electrode and the second electrode are disposed in respective blind vias that extend from the top major surface to a depth into the substrate, the first electrode and the second electrode each have a top surface that is substantially coplanar with the top major surface of the substrate, and the first electrode and the second electrode each have a bottom surface that is disposed above and away from the bottom major surface of the substrate.

2. The device of claim 1 wherein the first electrode includes a second ring-arranged to surround the first ring of the second electrode, and further comprising:
a second insulator arranged between the second ring and the first ring,
wherein the first ring and the second ring are concentric.

3. The device of claim 1 wherein the first insulator comprises the material of the substrate.

4. The device of claim 1 wherein the substrate is a glass substrate.

5. The device of claim 4 wherein the first electrode and the second electrode comprise copper.

6. The device of claim 1 wherein the substrate is a silicon substrate.

7. The device of claim 6 comprising:
a dielectric liner which lines sidewalls of the blind vias and the top major surface of the silicon substrate,
wherein the dielectric liner isolates the first electrode and the second electrode from the silicon substrate.

8. The device of claim 7 wherein the first electrode and the second electrode comprise copper.

9. The device of claim 1 further comprising:
a redistribution layer (RDL) disposed over the top major surface of the substrate,
wherein the RDL comprises contact pads coupled to the first electrode and the second electrode of the capacitor.

10. A device comprising:
an interposer having a top major surface and a bottom major surface; and
a cylindrical capacitor disposed in the interposer, the cylindrical capacitor including a first electrode, a second electrode, a first insulator, and a second insulator, the first electrode including a cylindrical core and an outermost ring, the second electrode including an inner ring, the first insulator separating the cylindrical core and the inner ring of the second electrode, and the second insulator separating the inner ring of the second electrode and the outermost ring of the first electrode,
wherein the first electrode and the second electrode are concentric, the first electrode and the second electrode are disposed in respective vias that have a depth from the top major surface of the interposer, the first electrode and the second electrode each have a top surface that is substantially coplanar with the top major surface of the interposer, and the first electrode and the second electrode each have a bottom surface that is disposed above and is away from the bottom major surface of the interposer.

11. The device of claim 10 wherein the interposer is a glass interposer.

12. The device of claim 10 wherein the first electrode and the second electrode comprise copper.

13. The device of claim 10 wherein the interposer is a silicon interposer.

14. The device of claim 13 comprising:
a dielectric liner which lines sidewalls of the vias and the first major surface of the silicon interposer,
wherein the dielectric liner isolates the first electrode and the second electrode from the silicon interposer.

15. The device of claim 14 wherein the first electrode and the second electrode comprise copper.

* * * * *